United States Patent
Stuetzler

(10) Patent No.: US 6,693,549 B2
(45) Date of Patent: Feb. 17, 2004

(54) SENSOR ARRANGEMENT

(75) Inventor: Frank-Juergen Stuetzler, Farmington Hills, MI (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/182,313
(22) PCT Filed: Jan. 26, 2001
(86) PCT No.: PCT/DE01/00311

§ 371 (c)(1),
(2), (4) Date: Feb. 6, 2003

(87) PCT Pub. No.: WO01/55729
PCT Pub. Date: Aug. 2, 2001

(65) Prior Publication Data
US 2003/0156036 A1 Aug. 21, 2003

(30) Foreign Application Priority Data
Jan. 29, 2000 (DE) .......................................... 100 03 992

(51) Int. Cl.⁷ .............................................. G08B 21/00
(52) U.S. Cl. ....................... 340/665; 340/436; 340/590; 307/10.1; 200/DIG. 10; 180/274
(58) Field of Search ................................ 340/665, 666, 340/667, 436, 437, 932.2, 590, 598; 180/274, 271; 200/61.44, 61.45 R, 61.53, DIG. 10; 307/10.1

(56) References Cited

U.S. PATENT DOCUMENTS

| | | | | |
|---|---|---|---|---|
| 2,938,977 | A | | 5/1960 | Koenig |
| 3,717,735 | A | | 2/1973 | Koenig |
| 5,680,909 | A | * | 10/1997 | Lofy .......................... 180/274 |
| 5,847,643 | A | * | 12/1998 | Keith ......................... 340/436 |
| 6,525,651 | B1 | * | 2/2003 | Heller ...................... 340/425.5 |

FOREIGN PATENT DOCUMENTS

DE          22 12 190          9/1973

* cited by examiner

*Primary Examiner*—Anh La
(74) *Attorney, Agent, or Firm*—Kenyon & Kenyon

(57) ABSTRACT

A sensor system is for detecting forces which, particularly in the case of a motor vehicle, lead to a deformation of components, e.g. body parts as the result of an accident. The sensor system includes a number of contact elements which are arranged on the component staggered one behind the other in a possible deformation direction, compressible insulation layers being disposed between the contact elements. The contact elements are electroconductively connected to an electronic evaluation circuit by which a contacting and/or de-contacting of adjacent contact elements, caused by a deformation, is able to be detected and converted into control and or regulating signals.

19 Claims, 3 Drawing Sheets

SENSOR ARRANGEMENT

FIELD OF THE INVENTION

The present invention relates to a sensor system, particularly for detecting mechanical forces which, for example, during a collision of a motor vehicle with an obstacle, may lead to an intrusion or deformation of components on this motor vehicle.

BACKGROUND INFORMATION

Such sensor systems may be used, for example, for so-called occupant-restraint systems in motor vehicles which, for instance, trigger airbags in response to accidents to protect the vehicle occupants from the results of a collision. For triggering these occupant-restraint systems, for example, the acceleration in the passenger compartment or at peripheral regions of the motor vehicle is measured. In addition to the sensor or sensors in the passenger compartment, the peripheral sensors may be, as a rule, installed at the deformable areas of the vehicle. Thus, for example, for better and early. recognition of lateral collisions, acceleration sensors may be installed on the so-called B-pillar and/or C-pillar of the vehicle, or on the seat crossmembers below the front seat.

In comparable manner, for better recognition of head-on crashes, sensors which likewise may measure the acceleration and convert the measured values into corresponding, electronically evaluable signals to better determine the severity of a crash may also be built into the front crash crumple zone of the vehicle.

Particularly in the case of lateral collisions, conventional acceleration sensors may permit rapid detection of a crash only if the sensor is directly struck. Thus, for example, when installed on the B-pillar, a fixed-pole crash into the door of the vehicle may be recognized too late. By themselves, pressure sensors may also cause problems with respect to a separation of the triggering and non-triggering conditions when installed at these locations, since they may be configured not to respond, for instance, to heavy door slamming. In the case of a triggering of driver and front-seat passenger airbags, as well, these pressure sensors may be configured not to interpret the pressure rise in the passenger compartment as deformation of the door.

Furthermore, in the case of a collision, the velocity of the intrusion by the obstacle may also be a decisive factor which determines the severity of the accident and the danger of injury for the occupants. In this context, the intrusion velocity may be linked to the width of the obstacle and the location of the impact. For example, a post having a small surface may intrude very deeply and quickly, while a wide barrier which impacts on the vehicle with the same velocity may intrude more slowly and not as deeply. If the post strikes the middle of the door, it may penetrate considerably more quickly than if it strikes on the B-pillar. The wider an obstacle is, the more slowly it may penetrate, and the softer the location of the impact, the deeper and more quickly it may penetrate.

German Published Patent Application No. 22 12 190 describes a sensor system in which deformation forces may be detected with, the aid of contact elements which may be arranged one after the other in a deformation direction. From this, the intrusion velocity may be determined. A contact between the contact elements may be effected by deformation of an elastic intermediate layer. U.S. Pat. No. 3,717,735 describes the construction of deformation sensors in such a manner that a closed contact may be opened in response to a deformation. U.S. Pat. No. 2,938,977 describes a contact configuration which may be provided with an intermediate layer on one side or both sides in partial areas.

SUMMARY OF THE INVENTION

A sensor system for detecting forces which may lead to a deformation of mechanical components, e.g., on motor vehicles, may provide for a number of contact elements chiefly on the possibly deformed components which may be arranged staggered one behind the other in a possible deformation direction.

Insulation layers, which may be compressible by the deformation of the component, may be disposed between the contact elements. The contact elements may be electroconductively connected to an electronic evaluation circuit by which a contacting and/or de-contacting of adjacent contact elements, caused by the deformation, may then be able to be detected and converted into control and/or regulating signals.

In a sensor system according to an example embodiment of the present invention, one contact element may represent a base element, and at least two contact elements may be positioned in front of it at predefined distances. The distances, i.e. the geometric configuration, and the material for these two compressible insulation layers may in each case be selected so that the intrusion velocity of the object causing the deformation may be able to be derived from the moments of the contacting and/or de-contacting of the contact elements situated one behind the other in the deformation direction.

In the present invention, a compressible insulation layer made, for example, of foamed plastic, between the contact elements may have the function of correctly defining the geometrical spacings of the contact elements. Therefore, the compression properties of the material, in the same manner as the temperature characteristic and the stiffness, may not be critical. In constructing the sensor system, care may only be required to be taken that the stiffness does not become so high over the course of the service life of the sensor system that compression of the sensor system is prevented. In some application cases, the deformation forces occurring may be so considerable that an evaluable deformation may already be ensured by them alone, even if the stiffness of the sensor system should vary.

The present invention may permit the construction of a so-called intrusion sensor for a motor vehicle which, in response to an accident, may detect in a simple manner the penetration of an obstacle into the components of the vehicle and, in so doing, may allow determination of both the velocity of the intrusion and the width of the impacting object, as well as the location of the intrusion. The intrusion sensor itself may be deformed by the penetration, and the deformation may be utilized to bring the contact elements in contact with one another. The deformation itself may also be utilized for determining the severity of the crash. Moreover, the intrusion sensor itself may be utilized as a structural element in such a manner that the deformation characteristic of the vehicle may be influenced.

In addition to the lateral placement, such an intrusion sensor may also be used for detecting head-on collisions or rear collisions. For example, it may then be mounted on the bumper between the bumper and the plastic cladding. In one such configuration, the sensor may measure the relative velocity of the crash, and the width of the obstacle and the location of the impact may again be determined. For example, using this intrusion sensor, information about the impacting obstacle may be obtained as well.

The signals generated by the contact elements may be evaluated in a simple manner by connecting the contact elements, e.g., via an RC circuit, directly to a microprocessor of the electronic evaluation circuit, the microprocessor being able to directly measure the moments, e.g. $T_1$ and $T_2$, mentioned above. However, moments $T_1$ and $T_2$ may also be determined by charging a capacitor, and sent as coded information directly to an analyzing unit, e.g. an airbag control unit in a motor vehicle.

For the contact elements to come reliably in contact, the sensor system may be required to be significantly deformed. Misuse conditions such as hammer blows and striking the door may as a rule not deform the sensor to the extent that both contact elements are closed. The misuse problems, which may be to some extent very serious for the conventional acceleration or pressure sensors, may be substantially prevented by the present invention. If, for example, the sensor is structurally mounted near a reinforcement tube in the door of a motor vehicle, then the safety with respect to misuse conditions may again be increased.

In the following, example embodiments of the present invention are indicated having configurations of the contact elements and of the insulation layers, as well as of an RC circuit, configured for particular application cases.

In these example embodiments, the compressible insulation layers may be arranged in at least one partial area of the surface of the contact elements, and in the area remaining in each case, a contact may be able to be produced with the adjacent contact element by compression of the insulation layer and/or by deformation of the respective contact element.

In one example embodiment, the insulation layers between the contact element situated at the top in the deformation direction and the middle contact element may be disposed in at least one lateral partial area, and the insulation layers between the middle contact element in the deformation direction and the base element may be arranged in two opposite lateral partial areas.

The contact elements may be provided geometrically here such that electrical contact may be ensured in response to complete compression of the insulation layer; this may be additionally supported by suitable bars on the base element and, if desired, on the other contact elements, as well. The base contact element itself may also be formed geometrically so that it may have an elevation in the middle. This elevation may be so high that it corresponds approximately to the thickness of the compressible material in the completely compressed state.

In another example embodiment, the insulation layer between the contact element situated at the top in the deformation direction and the middle contact element may be disposed in one lateral partial area, and the insulation layer between the middle contact element in the deformation direction and the base element may be arranged in the same lateral partial area.

Thus, in this case, the actual contact surfaces may be situated spatially next to the compressible areas. In this context, the base contact element may be constructed such that it is stable enough so that the upper and the middle contact elements and the compressible material are pressed together for the contacting first, before the base element is bent. So that the sequence of the compression remains defined, a stiffness may be selected for the first insulation layer in the region between the upper and the middle contact elements which is less than that of the second insulation layer in the region between the middle contact element and the base element. This may ensure that the upper and the middle contact elements are closed first before the second insulation layer is compressed at moment $T_2$.

In a further example embodiment, at least two contact elements are made of partial contact elements which, in the quiescent state, lie side by side, contacting. The compressible insulation layers are arranged in at least one partial area of the surface of the at least two contact elements, and in the area remaining in each case, a de-contacting, i.e. opening of the partial contact elements may be able to be effected by compression of the insulation layer and/or by deformation of the respective contact element.

With this example embodiment, an intrusion sensor may be implemented in that, due to the intrusion of an object and the resulting compression, the upper contact element is pressed, for example, via an electrically insulating spacer, onto a first closed contact of the middle contact element. In this context, the upper contact element may be formed geometrically so that the contact of the middle contact element is opened. If the sensor system is further compressed, then the middle contact element and an electrically insulating spacer press on a lower contact element on the base element and open it. The intrusion velocity may then in turn be determined from the time interval of this opening.

For an evaluation, the upper contact element and the base contact element may be made of a magnetic material, and the middle contact element may be a flat coil. In this case, a contacting of the contact elements may lead to a change in the impedance between the upper and the middle and between the middle and the base contact element. The closing of the contact elements may also be detected by one or more Hall sensors. According to an example embodiment, permanent magnets may be provided in the upper contact element and in the base contact element. The contacting of the upper and middle contact elements and/or of the middle and the base contact elements may be easily detectable by a contact of the Hall sensors with the permanent magnets.

In another example embodiment, the contact elements may be formed by two planar-like fracture ceramics which in each case may be separated by a compressible insulation layer. The fracture ceramics may be provided here with an electroconductive path or layer whose interruption is detectable. In this case, an interruption in response to the intrusion of an object may define moment T of the impact. A fracture of the upper ceramic defines moment $T_1$ of the impact, and the fracture of the lower ceramic defines moment $T_2$. The intrusion velocity may then be determined from the time difference between $T_1$ and $T_2$ and the thickness of the compressible insulation layer.

At least the upper and the middle contact elements may be divided in a direction, e.g. the longitudinal direction, into a plurality of contact regions, where in each case pairs of upper and middle contact elements are connected via separate lines to the evaluation circuit.

Information about the location of the deformation may also be obtained due to this division. Between the respective matching pairs, the intrusion velocity may now also be determined nearly independently for each partial area of the sensor system, and the width of the intruding object may be determined from the number of compressed subdivisions. Moreover, the location of the primary intrusion may also be determined from the time sequence of the closing of the respective contact pairs.

The already mentioned protective circuit in the connection of the contact elements may be implemented in a simple manner by a resistor network in which, for example, a parallel resistor situated in each case between the upper and the middle and between the middle and the base contact element, as well as a series resistor leading from the middle contact element are applied. The series resistor is connected by a first line, and the joined connection terminals of the parallel resistors are connected by a second line to the evaluation circuit.

If the contact elements are subdivided into a plurality of sub-regions, a resistor network may again be implemented, in which the contact elements are connected to the evaluation circuit via a resistor network, where in each of the divided contact regions, a parallel resistor is situated between the upper and the middle contact element. These parallel resistors are connected in series in the direction of the divided regions, and the outer connection terminals of this series circuit are run to the evaluation circuit. With this, the number of lines may be reduced via which the sensor system is connected to the evaluation circuit, without the evaluation capability suffering.

The surfaces of the contact areas of the contact elements may be treated in such a manner that no erosion may occur and the closing of the contacts may also be ensured over the entire service life of the sensor system. Since, when used in the motor vehicle, the sensor system may also be able to be mounted in the door or on the bumper of the motor vehicle, the sensor system may also be enclosed in a simple manner by a waterproof casing which, however, may permit a deformation without hindrance. For example, this casing may be a thin rubber casing which hermetically seals the sensor, but permits compression and a pressure equalization in response to temperature fluctuations. For example, the entire sensor system may also be incorporated into a casing of thin, easily deformable metal, such as a thin aluminum casing.

These and other features of further example embodiments of the invention, may be derived from the specification and the drawings. The individual features, each by itself alone or combined in the form of sub-combinations, may be able to be implemented in the example embodiments of the invention and in other fields, and may represent example embodiments which may be desirable by themselves.

DETAILED DESCRIPTION

Figure 1:
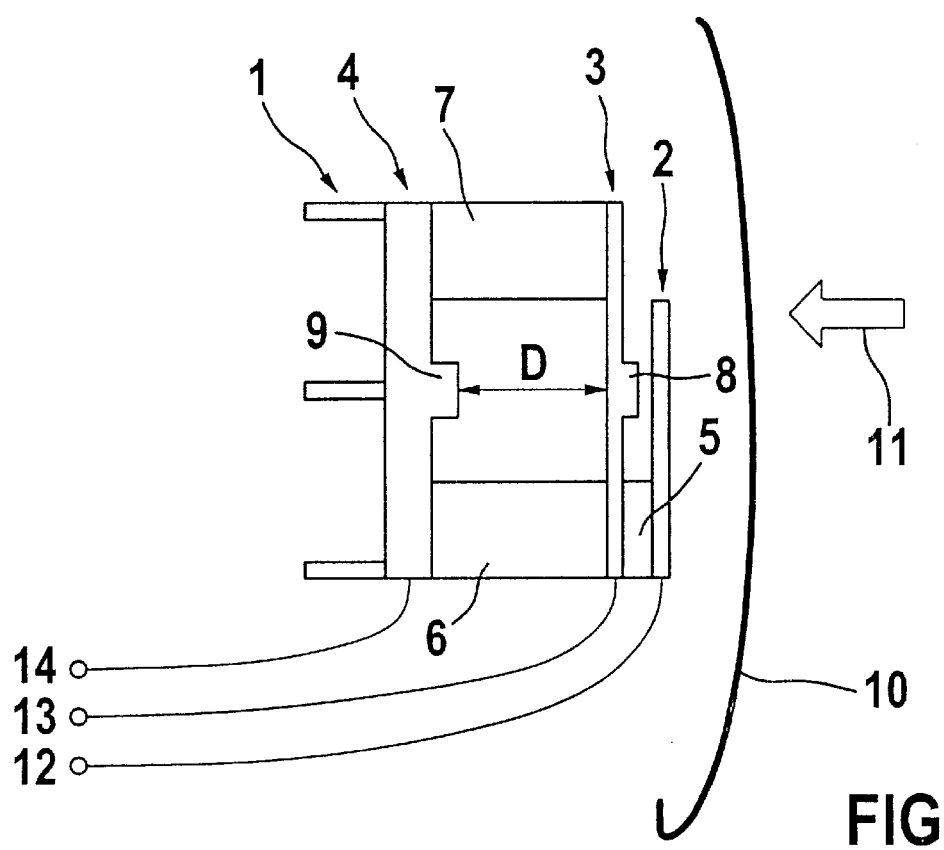
FIG. 1 is a schematic representation of a first example embodiment, in which the sensor system is mounted as an intrusion sensor in the door of a motor vehicle.

An example embodiment of a sensor system 1 illustrated in FIG. 1 includes an upper electroconductive contact element 2, a middle electroconductive contact element 3 and a third electroconductive contact element 4 as base element. Situated between contact elements 2, 3 and 4 are compressible insulation layers 5, 6 and 7 made, for example, of foamed plastic, which spatially separate contact elements 2, 3 and 4 at a predefined distance, distance D between middle contact element 3 and base element 4 in particular being significant here for the evaluation of the sensor signals.

Sensor system 1 is installed, for example, in door trim 10 of a motor vehicle, and is able to be deformed in a direction 11 during an accident. Contact elements 2, 3 and 4, possibly with bars 8 and 9, are provided in such a manner that an electrical contact may be ensured between these elements 2, 3 and 4 in response to complete compression of insulation layers 5, 6 and 7 because of a crash.

Sensor system 1 may be installed, for example, on the inside of the motor-vehicle door below the reinforcing tube. Sensor system 1 may cover the entire length of the door, for example, from the front stop at the so-called A-pillar up to the door lock. If door trim 10 is now pressed in by an impact of an object, then upper contact element 2 is pressed onto middle contact element 3 and is contacted to it, so that moment $T_1$ of the contacting may be detected via lines 12, 13 and 14 connected to these contact elements 2, 3 and 4. The obstacle then penetrates further and finally presses upper and middle contact elements 2 and 3 onto base element 4. The contact between middle contact element 3 and base element 4 is then closed at a moment $T_2$.

Intrusion velocity $V_i$ of the object may then be ascertained from the known distance D between middle contact element 3 and base element 4, and moments $T_1$ and $T_2$ according to the equation $$V_i = D/(T_2 - T_1) \tag{1}$$

Distance D may, for example, 2 cm, with which at a velocity of 20 m/s (corresponding to 72 km/h) a time difference $T_2-T_1$ of 0.02/20 sec corresponding to 1 ms results. This time difference may permit both a direct measurement by a microprocessor in the evaluation circuit, as well as a rapid triggering of actuators in the vehicle, such as, for example, an airbag.

Figure 2:
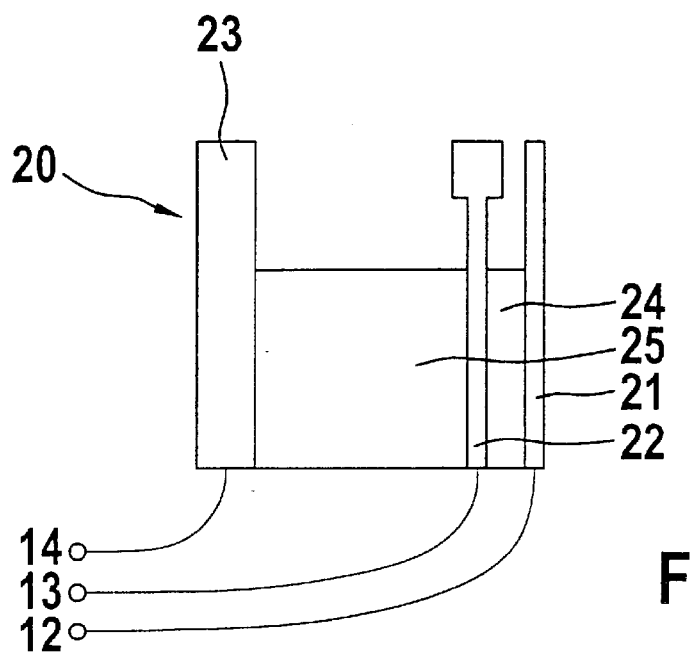
FIG. 2 illustrates a second example embodiment with a modification of the arrangement of contact elements and insulation layers in the intrusion sensor illustrated FIG. 1.

In an example embodiment illustrated in FIG. 2, an intrusion sensor 20 is provided with contact elements 21, 22 and 23 which, in a modification with respect to FIG. 1, are in each case provided on one side with an insulation layer 24 and 25. Intrusion velocity $V_i$ is determined here in the same manner as in the example embodiment illustrated in FIG. 1.

Figure 3:
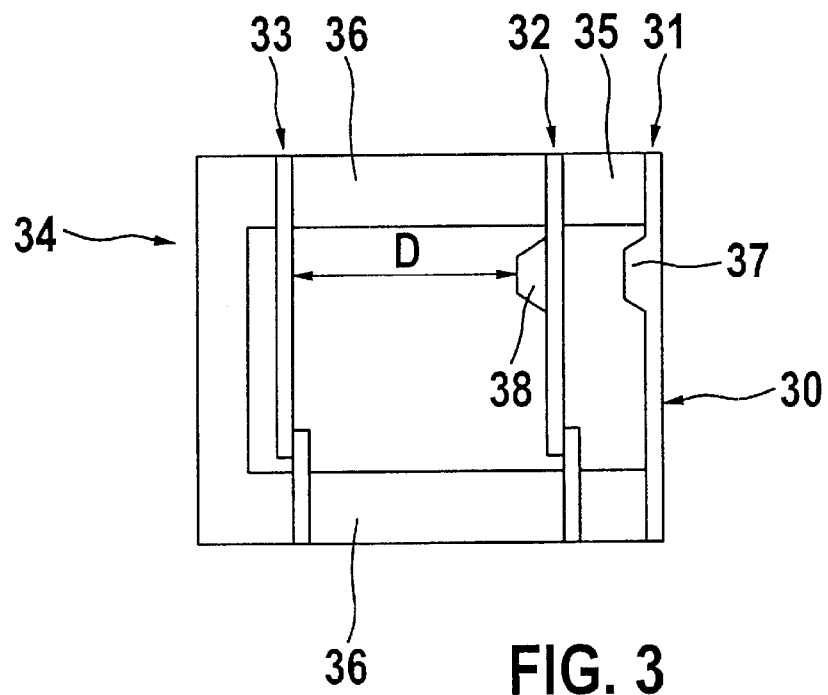
FIG. 3 illustrates a third example embodiment with a modification of the arrangement of contact elements and insulation layers in the intrusion sensor illustrated in FIG. 1, in which the contact elements are opened by a deformation.

FIG. 3 illustrates an example embodiment of a sensor system 30 in which an upper contact element is implemented as pressure plate 31. A middle contact element 32 and a lower contact element 33 are also provided on a base plate 34. Contact elements 32 and 33 are made of partial contact elements which, in the quiescent state, lie side by side, contacting. Compressible insulation layers 35 and 36 are applied between contact elements 31 and 32 and between 33 and 34.

In this case, contact elements 32 and 33 open by compression of insulation layers 35 and 36 in response to a deformation of sensor element 30. Upon intrusion of an object and the resulting compression of insulation layers 35 and 36, upper pressure plate 31 presses on a first closed contact of middle contact plate 32. Pressure plate 31 is formed geometrically so that the contact of middle partial contact elements 32 is opened, for example, via an electrically insulating elevation 37. If the sensor system is further compressed, then middle contact element 32 and an electrically insulating elevation 38 press on lower contact element 33 and open the contact here. As mentioned above, intrusion velocity V$_i$ may again be determined from the time interval of the opening.

Figure 4:
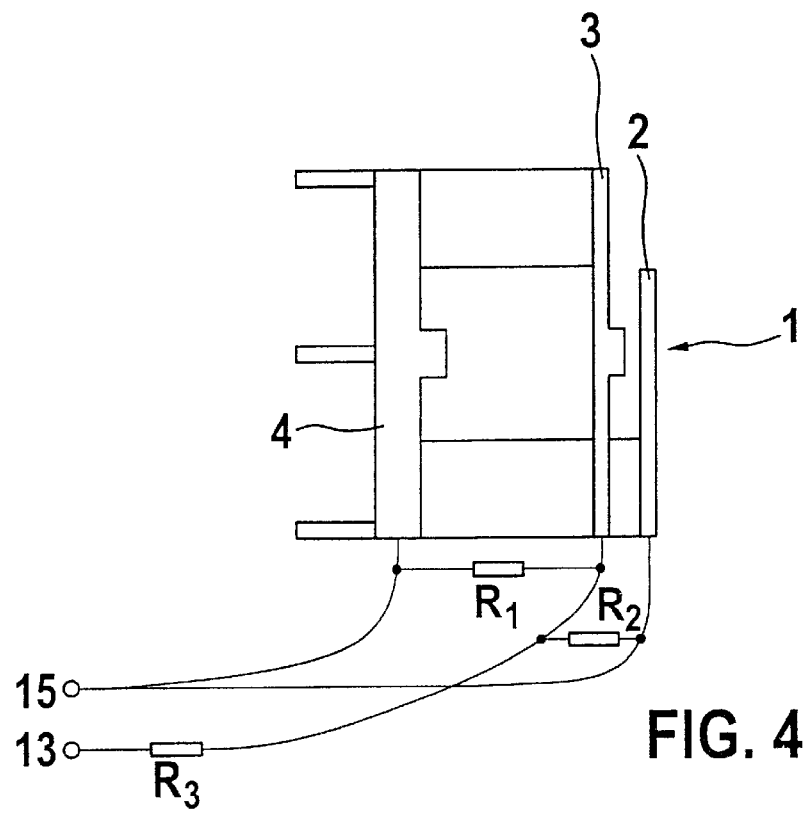
FIG. 4 illustrates an intrusion sensor illustrated in FIG. 1 having a resistor network as RC circuit.

As mentioned above, it may be useful if contact elements 2, 3, 4; 21, 22, 23 or 31, 32, 33 are able to be connected via an RC circuit directly to the microprocessor of the evaluation circuit, the microprocessor being able to directly measure times T$_1$ and T$_2$. FIG. 4 illustrates an example embodiment for implementing a resistor network in conjunction with sensor system 1 described with reference to FIG. 1. Here, a resistor R$_1$ is positioned in parallel with respect to contact elements 3 and 4, and a resistor R$_2$ is arranged in parallel with respect to contact elements 2 and 3. From contact element 3, a series resistor R$_3$ is connected to connection terminal 13. Therefore, series resistor R$_3$ is connected by a first line, and the joined connection terminals of resistors R$_1$ and R$_2$ of upper and base contact elements 2 and 3, respectively, are connected by a second line via connection terminal 15 to the evaluation circuit.

Thus, in this example embodiment, the closing of both contacts may be determined using only two connections of the evaluation circuit to sensor system 1. If no impact exists at this intrusion sensor 1, and therefore exhibits no deformation, the total resistance is $$R=R_3+1/(1/R_1+1/R_1). \qquad (2)$$

In the event of an impact, then initially the upper contact between contact elements 2 and 3 is closed. The total resistance is then $$R=R_3+R_2. \qquad (3)$$

If sensor system 1 is further deformed and the lower contact closes, then the total resistance is $$R=R_1. \qquad (4)$$

Figure 5:
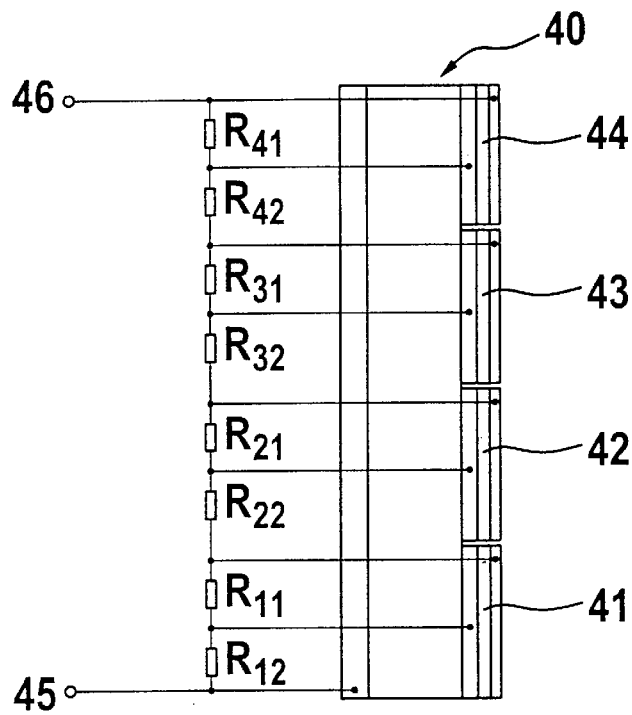
FIG. 5 illustrates a further example embodiment of an intrusion sensor having regions of the contact elements that are distributed in the longitudinal direction and are connected via a resistor network.

If the total length of a sensor system 40 illustrated in FIG. 5 is divided into a plurality of narrower regions 41, 42, 43 and 44, then information about the location of a deformation may be obtained. To that end, the upper and middle contact elements are in each case divided here into a plurality of regions, so that between respective matching pairs of upper and middle contact element and the lower base element, the intrusion velocity may now be determined nearly independently for each partial region 41, 42, 43 and 44 of sensor system 40.

The width of the intruding object may be determined from the number of compressed regions 41, 42, 43 or 44, and the location of the primary intrusion may be determined from the time sequence of the closing of the respective pairs of contact elements. The resistor network illustrated in FIG. 5 usable here, in each of divided regions 41, 42, 43 and 44, contains a parallel resistor R$_{11}$, R$_{12}$; R$_{21}$, R$_{22}$; R$_{31}$, R$_{32}$ and R$_{41}$, R$_{42}$ in each case between the upper and the middle contact element and the middle and the base element. These parallel resistors are connected in series in the direction of the divided regions, and the outer connection terminals of this series circuit are connected to the evaluation circuit via connection terminals 45 and 46.

Figure 6:
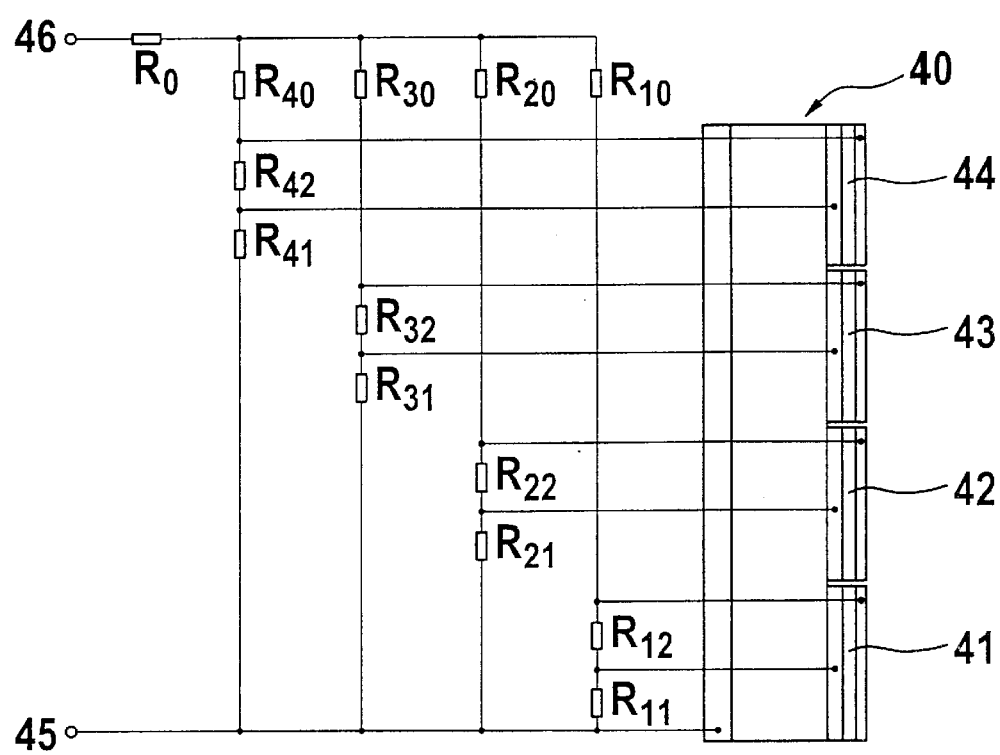
FIG. 6 illustrates an intrusion sensor illustrated in FIG. 5 having an expanded resistor network.

FIG. 6 illustrates a modification of the resistor network illustrated in FIG. 5, where the resistor pairs of parallel resistors R$_{11}$, R$_{12}$; R$_{21}$, R$_{22}$; R$_{311}$ R$_{32}$ and R$_{41}$, R$_{42}$ are run on one side in parallel via a series resistor R$_{10}$, R$_{20}$, R$_{30}$ and R$_{40}$, as well as a total series resistor R$_0$ to connection terminal 46, and with the other side directly to connection terminal 45.

What is claimed is:

1. A sensor system for detecting forces which lead to a deformation of a mechanical component, comprising:
   a plurality of contact elements arranged on the mechanical component and staggered one behind the other in a possible deformation direction, the contact elements including a base contact element and at least two contact elements arranged at predefined distances thereto;
   at least two compressible insulation layers disposed between the contact elements, one of the at least two compressible insulation layers and the predefined distances configured so that an intrusion velocity of an object causing the deformation is derivable from moments of at least one of a contacting and a de-contacting of the contact elements arranged one behind the other in the deformation direction; and
   an electronic evaluation circuit electroconductively connected to the contact elements and configured to detect at least one of the contacting and the de-contacting of adjacent contact elements, the electronic evaluation circuit configured to convert the at least one of the contacting and the de-contacting of adjacent contact elements into at least one of control and regulating signals;
   wherein the at least two compressible insulation layers include a first insulation layer arranged in a region between an upper and a middle contact element and a second insulation layer arranged in a region between the middle contact element and the base element, the first insulation layer having less stiffness than the second insulation layer.

2. The sensor system according to claim 1, wherein the compressible insulation layers are arranged in at least one partial area of a surface of the contact elements, a remaining area of the surface of the contact element configured to contact an adjacent contact element by at least one of a compression of an insulation layer and a deformation of a respective contact element.

3. The sensor system according to claim 1, wherein the contact elements include at least two contact elements having partial contact elements which, in a quiescent state, are side by side in contact with each other, the compressible insulation layers arranged in at least one partial area of a surface of the at least two contact elements, the partial contact elements configured to be de-contacted in a remaining area of the surface by at least one of a compression of a respective insulation layer and a deformation of the respective contact element.

4. The sensor system according to claim 2, wherein the first insulation layer is arranged in at least one lateral partial area and the second insulation layer includes a first portion and a second portion arranged in two opposite lateral partial areas.

5. The sensor system according 2, wherein the first and second insulation layers are arranged in a same lateral partial area.

6. The sensor system according to claim 1, wherein the compressible insulation layers are made of foamed plastic.

7. The sensor system according to claim 1, wherein the upper contact element and the base contact element are made of a magnetic material, and the middle contact element includes a flat coil, and a contacting of the contacting elements leads to a change in an impedance between the upper and the middle, and between the middle and the base contact element.

8. The sensor system according to claim 1, further comprising a Hall sensor configured to detect a contacting of the contact elements.

9. The sensor system according to claim 8, further comprising permanent magnets arranged in the upper contact element and in the base contact element;

wherein at least one Hall sensor is mounted on the middle contact element, and one of a contacting of the upper and middle contact elements and a contacting of the middle and base contact elements is detectable by contact of the Hall sensors with the permanent magnets.

10. The sensor system according to claim 1, wherein the contact elements include two planar-like fracture ceramics separated by a compressible insulation layer, the fracture ceramics including an electroconductive path having a detectable interruption.

11. The sensor system according to claim 1, wherein at least the upper and the middle contact elements are divided in one direction into a plurality of regions, in which pairs of upper and middle contact elements are in each case connected via separate lines to the evaluation circuit.

12. The sensor system according to claim 11, wherein the direction includes a longitudinal direction.

13. The sensor system according to claim 1, further comprising a resistor network arranged to connect the contact elements with the evaluation circuit.

14. The sensor system according to claim 13, wherein the evaluation unit includes a first connection terminal and a second connection terminal, the resistor network including a first parallel resistor arranged between the upper and the middle contact element, a second parallel resistor arranged between the middle and the base contact element, a series resistor leading from the middle contact element, a first line arranged to connect the series resistor to the evaluation circuit via the first connection terminal and a second line arranged to connect joined connection terminals of the first and second parallel resistors to the evaluation circuit via the second connection terminal.

15. The sensor system according to claim 11, further comprising a resistor network configured to connect the contact elements with the evaluation circuit, the resistor network including parallel resistors arranged between the upper and the middle contact elements, the parallel resistors including a parallel resistor in each of the divided regions, the parallel resistors connected in series in a direction of the divided regions to from a series circuit that includes outer terminals connected to the evaluation circuit.

16. The sensor system according to claim 11, further comprising a resistor network configured to connect the contact elements with the evaluation circuit, the resistor network including parallel resistors arranged between the upper and the middle contact elements, the parallel resistors including a pair of parallel resistors associated with each of the divided regions, the pair including a first end and a second end, the first end connected to a first connection terminal of the evaluation circuit, the resistor network including a series resistor connected to each pair and a total series resistor configured to jointly connect each series resistor to a second connection terminal of the evaluation circuit.

17. The sensor system according to claim 1, further comprising a corrosion-protection coating covering the contact elements and a moisture-proof protective film covering the sensor system.

18. The sensor system according to claim 17, wherein the moisture-proof protective film includes a rubber elastic material.

19. The sensor system according to claim 1, further comprising a hermetically sealed metal casing entirely enclosing the sensor system, the hermetically sealed metal casing including a thin, soft, easily compressible metal and a moisture-proof electrical connection to the outside.

* * * * *